(12) United States Patent
Chen et al.

(10) Patent No.: US 10,424,950 B2
(45) Date of Patent: Sep. 24, 2019

(54) USB CONTROLLER ESD PROTECTION APPARATUS AND METHOD

(71) Applicant: Texas Instruments Incorporated, Dallas, TX (US)

(72) Inventors: Zhong Chen, Fayetteville, AR (US); Ralph Braxton Wade, III, McKinney, TX (US); Ming Xiao, Shenzhen (CN)

(73) Assignee: Texas Instruments Incorporated, Dallas, TX (US)

( * ) Notice: Subject to any disclaimer, the term of this patent is extended or adjusted under 35 U.S.C. 154(b) by 811 days.

(21) Appl. No.: 14/855,406

(22) Filed: Sep. 16, 2015

(65) Prior Publication Data

US 2016/0336741 A1    Nov. 17, 2016

Related U.S. Application Data

(63) Continuation of application No. PCT/CN2015/078958, filed on May 14, 2015.

(51) Int. Cl.
  *H02J 7/00* (2006.01)
  *H01L 27/02* (2006.01)
  *H02H 9/04* (2006.01)

(52) U.S. Cl.
  CPC ........ *H02J 7/0029* (2013.01); *H01L 27/0255* (2013.01); *H02H 9/046* (2013.01)

(58) Field of Classification Search
  CPC .......... H02J 7/0029; H02H 9/046; H05F 3/00; G06F 13/362
  USPC ........................................ 320/107, 162, 163
  See application file for complete search history.

(56) References Cited

U.S. PATENT DOCUMENTS

| | | | |
|---|---|---|---|
| 5,747,834 A | 5/1998 | Chen et al. | |
| 5,780,905 A | 7/1998 | Chen et al. | |
| 5,850,095 A | 12/1998 | Chen et al. | |
| 5,982,217 A | 11/1999 | Chen et al. | |

(Continued)

FOREIGN PATENT DOCUMENTS

| | | |
|---|---|---|
| CN | 2750618 Y | 1/2006 |
| CN | 2772067 Y | 4/2006 |

(Continued)

OTHER PUBLICATIONS

Universal Serial Bus 3.1 Specification, Hewlett-Packard Company, Intle Corporation, Microsoft Corporation, Renesas Corporation, ST-Ericsson, Texas Instruments, Revision 1.0, Jul. 26, 2013, 631 pgs. (Uploaded in 7 parts).

(Continued)

*Primary Examiner* — Edward Tso
*Assistant Examiner* — Aaron Piggush
(74) *Attorney, Agent, or Firm* — Rose Alyssa Keagy; Charles A. Brill; Frank D. Cimino

(57) ABSTRACT

USB interface and charging port controller integrated circuits and systems are presented for interfacing USB power and data signaling with a host circuit, in which an ESD protection diode is integrated in the IC, having an anode connected to a data terminal of the IC and a cathode connected to the positive USB bus voltage terminal for directing ESD transient current from the data terminal to the USB bus voltage terminal for dissipation to an external bus capacitance connected between the USB bus voltage terminal and a USB ground node on a host system circuit board.

20 Claims, 4 Drawing Sheets

(56) References Cited

U.S. PATENT DOCUMENTS

| | | | |
|---|---|---|---|
| 6,016,002 | A | 1/2000 | Chen et al. |
| 6,946,817 | B2 | 9/2005 | Fischer et al. |
| 7,268,561 | B2 | 9/2007 | Zhu |
| 7,675,571 | B2 | 3/2010 | Cheng et al. |
| 7,895,385 | B2 | 2/2011 | Raju |
| 8,386,814 | B2 | 2/2013 | Tom et al. |
| 8,442,586 | B2 | 5/2013 | Danis et al. |
| 8,890,248 | B2 | 11/2014 | Pauletti et al. |
| 2007/0188132 | A1 | 8/2007 | Hussain et al. |
| 2008/0029782 | A1 | 2/2008 | Carpenter et al. |
| 2011/0016334 | A1 | 1/2011 | Tom et al. |
| 2011/0016341 | A1 | 1/2011 | Tom et al. |
| 2011/0298426 | A1 | 12/2011 | Hussain et al. |
| 2012/0119696 | A1 | 5/2012 | Picard |
| 2013/0003242 | A1 | 1/2013 | Lin et al. |
| 2013/0290765 | A1 | 10/2013 | Waters et al. |
| 2014/0312691 | A1* | 10/2014 | Doljack ............... H02J 7/0036 307/29 |
| 2016/0149402 | A1* | 5/2016 | Ye ......................... H02H 9/041 361/56 |
| 2017/0192916 | A1* | 7/2017 | Luo ....................... G06F 13/385 |

FOREIGN PATENT DOCUMENTS

| | | |
|---|---|---|
| CN | 101399882 A | 4/2009 |
| CN | 10634885 A | 1/2010 |
| JP | 2012059950 A | 3/2012 |

OTHER PUBLICATIONS

USB Battery Charging 1.2 Compliance Plan, Copyright 2011 USB Implementers Forum Inc., Revision 1.0, Oct. 12, 2011, 166 pgs. (Uploaded in 3 parts).

Battery Charging Specification, Copyright 2010 USB Implementers Forum Inc., Revision 1.2, Dec. 7, 2010, 71 pgs.

The I2C-Bus and How to Use it (Including Specifications), Phillips Semiconductors, Apr. 1995 update, 24 pgs.

Universal Serial Bus PS Interface White Paper, Editor Richard Wahler, Revision 1.00, Apr. 14, 2014, 19 pgs.

UM 10204 I2C-Bus Specification and User Manual, NXP, Rev. 5-9, Oct. 2012, 64 pgs.

Joosting, Qualcomm Quick Charge 2.0 Smartphone Charger Reference Design, EE Times, Europe, Oct. 21, 2013, 2 pgs.

"USB Charging Port Controller and Power Switch with Load Detection", Texas Instruments, TPS2546, SLVSBJ2A—Feb. 2013—Revised Feb. 2013, 40 pgs.

"USB Peripheral/Host Controller with SPI Interface", Maxim Integrated, MAX3421E, 19-3953; Rev. 4; Jul. 2013, 28 pgs.

"TPDS214 USB OTG Companion Device with Vbus Over Voltage Protection, Over Current Protection, and Four Channel ESD Protection", Texas Instruments, TPD4S214, SLVSBR1F—Jan. 2013—Revised Jan. 2015, 28 pgs.

* cited by examiner

USB CONTROLLER ESD PROTECTION APPARATUS AND METHOD

REFERENCE TO RELATED APPLICATIONS

This application is a continuation of, and claims priority to and the benefit of, International Application No PCT/CN2015/078958, filed May 14, 2015 and entitled "USB CONTROLLER ESD PROTECTION APPARATUS AND METHOD", the entirety of which is hereby incorporated by reference.

FIELD OF THE INVENTION

The present disclosure relates to Universal Serial Bus (USB) control circuitry and electrostatic discharge (ESD) protection apparatus therefor.

BACKGROUND

USB ports are found on a variety of electronic devices including desktop computers, automobile dashboard consoles and other host devices as well as battery-powered portable devices such as laptop computers, tablets, mobile phones, e-readers, MP3 players, etc. USB ports are accessible via standardized USB cable connections to provide serial communications between devices, as well as electrical power transfer for charging and operating battery-powered peripheral devices. Moreover, dedicated charging devices are available having multiple USB ports for charging various portable devices, which may include circuitry for fast charging certain peripheral devices. USB compatible systems typically include interface chips mounted to an internal circuit board to interface USB data and power connections to host system circuitry such as power circuits and host processors. Electronic devices are typically tested for compliance with ESD test standards to confirm the ability to safely conduct transient ESD currents. Certain Human Body Model (HBM) tests involve conduction of a current of approximately 1.3 A at 2 kV, whereas more rigorous standards require conduction of higher transient currents. For instance, the 8 kV IEC61000-4-2 contact discharge and ISO 10605 standards verify protection against transient currents at or near 30 A.

Many circuit boards having USB connectors and interface circuitry include dedicated ESD protection integrated circuits (ICs) or discrete ESD protection circuit components mounted to the circuit board for compliance with the applicable standards. For USB data lines, however, many conventional ESD protection circuits are not feasible or desired. For instance, high-speed data operation on positive and negative USB data lines (DP and DM, also indicated as D+ and D−) requires minimal resistance and stray capacitance on the data lines, thus rendering resistive or capacitive clamping type ESD protection circuitry unsuitable for USB data line protection. Moreover, external clamping diodes may add undesirable stray capacitance to the data lines.

Many different circuit solutions have been used for protecting circuitry against ESD events in general, such as dedicated NMOS-based or other active ESD circuits, but these solutions significantly increase the die area and cost of an integrated circuit solution. Furthermore, dedicated ESD ICs and/or other board level circuitry occupies valuable board space, and can unduly increase the impedance with respect to USB data lines. For example, external IEC protection components (i.e. off-chip IEC diodes) for the USB DP and DM lines are not preferred due to added cost and parasitic capacitance on the system board. The impacts of implementing on-chip system-level ESD structures include significantly growing the IC die area and increasing of total IC cost. Conventional solutions therefore often include external protection diodes or clamping circuits placed on system board, where the ESD current is discharged through the external diode to ground. However, the clamping voltage is usually high for external ESD protection structures and providing sufficient ESD protection for advanced ESD standards is therefore difficult or impossible without adding undesirable series resistance and stray capacitance on the USB data pins, and the use of such external protection diodes increases the total system cost and size. Moreover, provision of on-chip ESD structures requires significant increase in the IC die space.

SUMMARY

In accordance with one or more aspects of the present disclosure, a USB interface integrated circuit is provided which includes first and second power terminals for a positive USB bus voltage and USB ground, respectively, as well as a first data terminal for connection to a data terminal of a USB connector via a first data connection or trace of the host circuit board. The integrated circuit also includes a first diode formed in the integrated circuit, having an anode electrically connected to the first data terminal, and a cathode electrically connected to the first power terminal. In certain embodiments, a second diode is formed in the integrated circuit, with an anode electrically connected to a second IC data terminal and a cathode electrically connected to the first power terminal. Third and fourth diodes are provided in various embodiments of the integrated circuit, with anodes connected to the second or ground power terminal and individually having anodes connected to the respective first and second data terminals. Further diode connections are provided from one or both of the data terminals to a clamping Zener diode in other embodiments.

In certain applications, the first and second diodes provide a conduction path for directing transient current from the corresponding data terminals to the first power terminal to facilitate dissipation of ESD and other transient current energy in a connected external USB bus capacitance on the host circuit board. The presently disclosed embodiments facilitate provision of on-chip integrated ESD protection solutions while mitigating adverse impact to USB data line operational performance for charging port controller controllers and other USB interface ICs, and can be employed to reduce or avoid the need for board-mounted ESD protection circuitry or dedicated ESD protection ICs. In this manner, the space and cost can be reduced for circuit boards having USB ports and associated circuitry. Moreover, the concepts of the present disclosure can be employed to provide USB interface ICs with ESD protection for USB data lines at a lower cost and using less die area than previous on-chip ESD protection circuits.

DESCRIPTION OF THE VIEWS OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
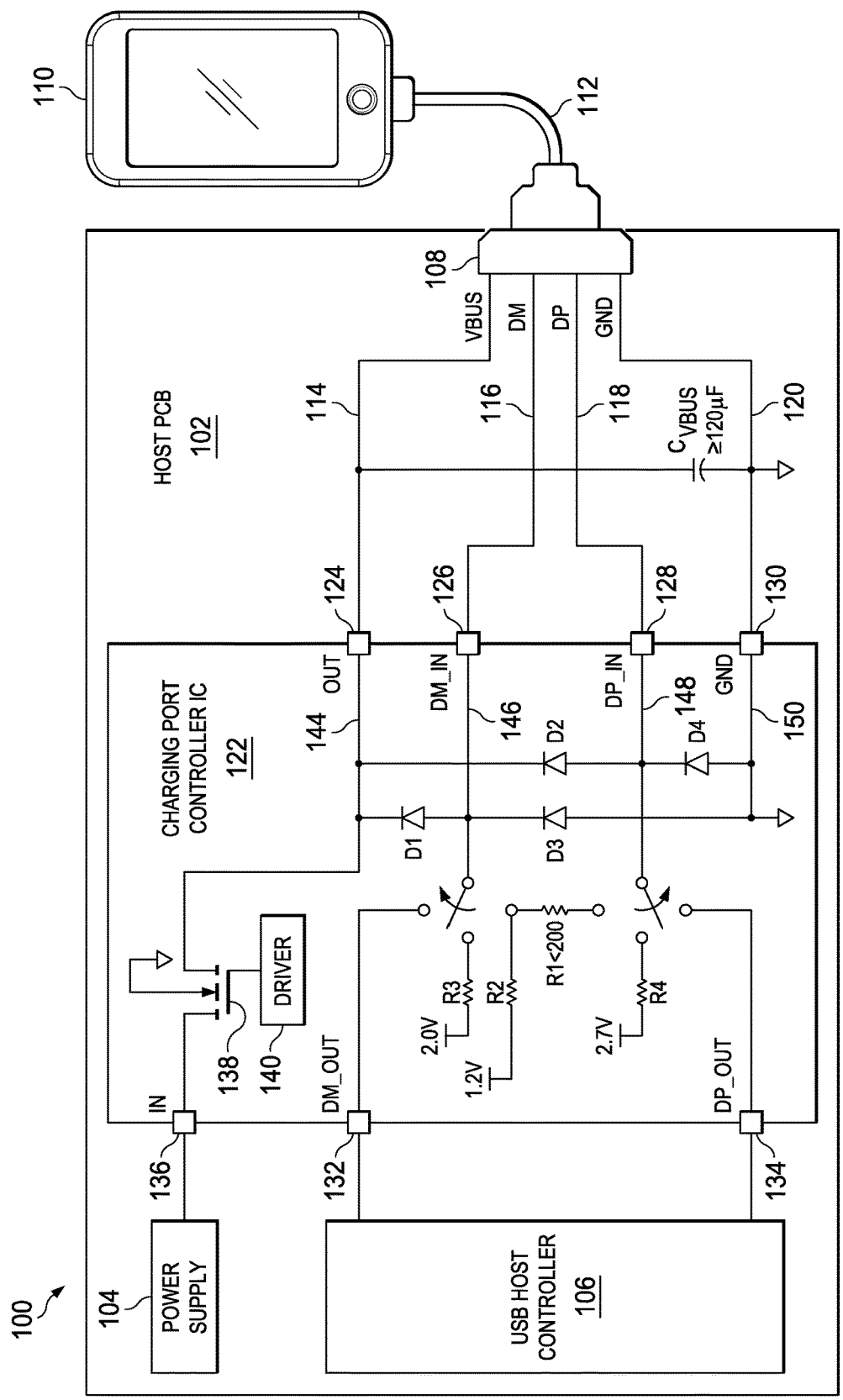
FIG. 1 is a partial schematic top plan view illustrating a host circuit board assembly with a USB port and associated charging port controller IC with integral ESD protection diodes for USB data lines.

One or more embodiments or implementations are hereinafter described in conjunction with the drawings, wherein like reference numerals are used to refer to like elements throughout, and wherein the various features are not necessarily drawn to scale.

FIG. 1 illustrates a system 100 with a host printed circuit board or PCB 102 including a power supply 104 and a USB host controller circuit or IC 106, along with a USB connector 108 shown connected to a peripheral device 110 via a USB cable 112. A charging port controller IC 122 is provided on the host PCB 102, including various conductive pins or pads, referred to herein as terminals which can be soldered or otherwise electrically connected to corresponding plated through holes or surface mount pads of the circuit board 102 using any standard direct soldering and/or socketed arrangement. The circuit board 102 includes various conductive traces or other conductive structures referred to herein as connections for providing electrical connection of four or more pins or terminals of the USB connector 108 with corresponding terminals 124, 126, 128 and 130 of the charging port controller IC 122 in order to electrically connect power and data lines of the connected peripheral device 110 with the charging port controller IC 122. In particular, the USB connector 108 includes a positive power terminal (pin or socket) for providing a positive bus voltage for operation and/or charging of the connected peripheral device 110 (VBUS) with a first power connection 114 of the host circuit board 102 providing electrical coupling (e.g., connection) of the VBUS terminal with a first power terminal 124 of the IC 122.

In addition, a second power terminal 130 of the integrated circuit 122 provides electrical coupling to a USB ground terminal (GND) of the USB connector 108 via electrical coupling through a second power connection of the circuit board 102. The USB interconnection further provides first and second data terminals for a negative data line (DM) and a positive USB data line (DP) of the USB connector 108, which are respectively coupled (e.g., connected) through first and second data connections 116 and 118 with corresponding first and second data terminals 126 and 128 of the IC 122. The USB connector 108 can be any suitable connector configured to interface with a standard USB cable 112, for example, an A-type or a B-type USB cable plug or receptacle having any suitable number of connections according to relevant USB standards, where certain embodiments of the connector 108 can accommodate more than four connections, and can be adapted to receive or interface with a male connector (plug) or a female connector (receptacle) and may include pins and/or sockets for the VBUS, DM, DP and GND signals.

As further shown in FIG. 1, the IC 122 in this example is a charging port controller including charging control circuitry between the first power terminal 124 and a power input terminal 136. The power input terminal 136 is coupled to receive power from a power supply 104 with the charging control circuitry including a switching device 138 (e.g., a MOSFET in this embodiment) with a gate control terminal operated by a driver circuit 140 for controlling charging current supplied to the first power terminal 124. In operation, the charging port controller IC 122 selectively operates the switch 138 to regulate charging or operating current provided to a connected peripheral device 110 from the power supply 104 through the switch 138 and along a conductive IC path or node 144 at a positive bus voltage VBUS (e.g., 5 V in one implementation). In the illustrated example, moreover, the first power terminal 124 provides a bus voltage output signal OUT to provide a positive bus voltage at the USB bus voltage terminal VBUS of the USB connector 108. The positive bus voltage provided at the OUT first power terminal 124 is positive relative to a circuit board ground voltage at the second power terminal 130 (GND) including a conductive ground structure electrically coupled with the second power connection 150 within the IC 122. The input power from the power supply 104 may also be used for powering other circuitry (not shown) within the charging port controller IC 122 in certain implementations. Although illustrated in the context of a charging port controller IC 122 having charging control circuitry 138, 140, the various ESD protection concepts of the present disclosure find utility in association with other USB interface integrated circuits, for example, USB host controller ICs or other integrated circuits configured for operational coupling with power and data lines of a USB port (e.g., VBUS, GND, DM and DP).

The circuit board 102 also provides conductive first and second conductive data connections 116 and 118, respectively, such as circuit board traces connecting the corresponding data terminals DM and DP of the USB connector 108 respectively with the first and second data terminals 126 and 128 of the IC 122. Internally, the data terminals 126 and 128 are electrically coupled inside the IC 122 with other circuitry by conductive structures 146 and 148, where the conductive data structures 146 and 148 as well as the positive and ground features 144 and 150 can be metallization layer traces, interlayer contacts and other conductive features, etc. or combinations thereof formed on or in the integrated circuit 122. In the illustrated charging port controller IC embodiment 122, the conductive data structures 146 and 148 electrically couple the USB data signals DM_IN and DP_IN from the IC data terminals 126 and 128 to a switching circuit schematically shown in FIG. 1 for selective connection with first and second data outputs terminals 132 and 134 to provide data signaling DM_OUT and DP_OUT, respectively, to host circuitry 106.

In the illustrated system 100, the host PCB 102 includes a USB host controller integrated circuit 106 with data lines connected to the charging port controller IC terminals 132 and 134. As previously mentioned, USB interface circuitry other than charging port controllers may be provided with on-chip ESD protection circuitry as disclosed herein for interfacing with a USB port. For example, other embodiments are possible in which a USB host controller IC 106 includes the ESD protection features disclosed herein for directly interfacing with a USB port, for example, without requiring charging control circuitry. In the illustrated embodiment of FIG. 1, the data line switching circuitry allows selective connection of the DM_IN and DP_IN signaling along conductive features 146 and 148 directly to the DM_OUT and DP_OUT lines via the terminals 132 and 134. Other possible switch circuit configurations connect the DM_IN conductive structure 146 through a resistor R3 to a 2.0 V node or to a node joining resistors R1 and R2 with R2 connected to a 1.2 V supply. In addition, though illustrated lower switch includes switching states to selectively connect the DP_IN conductive structure 148 through a resistor R4 to a 2.7 V supply or to the lower and of resistor R1. In operation, the data line switching circuitry facilitates detection of connection of peripheral devices 110 to the USB connector 108 and other features and functionality according to relevant USB standards.

The integrated circuit 122 in FIG. 1 also provides on-chip system-level protection for USB data lines against electrostatic discharge or other high voltage and/or high current transient events by way of diodes D1, D2 formed on or in or otherwise integral to the IC 122 for providing a conduction path to direct transient current from the corresponding data terminal 126 or 128 to the positive USB bus voltage node at the first power terminal 124. In this regard, the relevant USB standards specify a minimum of 120 µF across the USB power bus between the VBUS line 114 and the ground or GND line 120, where the host circuit board 102 in this case includes a single capacitor $C_{VBUS}$ providing the required capacitance. In other applications, such as multi-port USB configurations, the bus capacitance $C_{VBUS}$ may be provided by more than one capacitor device on the host circuit board 102. In certain embodiments, as shown in FIG. 1, third and fourth diodes D3 and D4 are also provided, with anodes connected to the ground conductive structure 150 and cathodes respectively connected to the data line conductive structures 146 and 148.

The inventors have appreciated that chip-based integral ESD protection can be provided by diodes D1 and D2 coupled as shown in FIG. 1 in order to direct the ESD-related transient current from the data terminals 126, 128 to the first power terminal 124 for dissipation in the capacitance $C_{VBUS}$. Moreover, since the voltages along the DM and DP lines for normal data transfer signal or in signaling during USB operation are typically derived from, and less than, the USB bus voltage VBUS (e.g., less than 5 V), the ESD protection diodes D1 and D2 will normally not be forward biased, and thus do not adversely contribute to stray capacitance along the data lines DM and DP. This is in contrast to previous circuit board based protection diodes mounted to a circuit board 102. Moreover, the provision of the diodes D1 and D2 inside the integrated circuit 122 advantageously saves printed circuit board space compared with discrete component and/or dedicated IC type ESD protection circuitry, and also provides a much lower cost solution while providing ESD protection. Moreover, the ESD protection capitalizes on the presence of the existing external VBUS capacitor $C_{VBUS}$ already present on the host system board 102 in order to meet system-level ESD requirements with minimum impact of chip-level IC design. Further in this regard, the disclosed solution does not significantly impact the impedances of the DM or DP lines, and therefore does not adversely affect communications between the host system 100 and a connected peripheral device 110. Furthermore, the inventors have appreciated that parallel connected multi-port USB systems also have a minimum required capacitance specified at 120 µF, and thus the ESD protection provided in the USB interface integrated circuit 122 is operable in single or multi-port applications.

Referring also to FIGS. 2-5, FIG. 2 illustrates operation of the on-chip ESD protection diode D1 for directing transient current from the first USB data terminal 126 of the IC 122 to the positive terminal of the board-mounted USB bus capacitance $C_{VBUS}$ through the IC VBUS terminal 124. In this situation, an ESD source 160 introduces a transient current on the DM data line 116 of the circuit board 102, for example, via the USB connector 108. In practice, the ESD event may occur in use of the host PCB 102, or during ESD protection testing using a source 160 to provide a standardized ESD transient current for evaluating the IC 122 and the overall system 100 including the host PCB 102.

Figure 3:
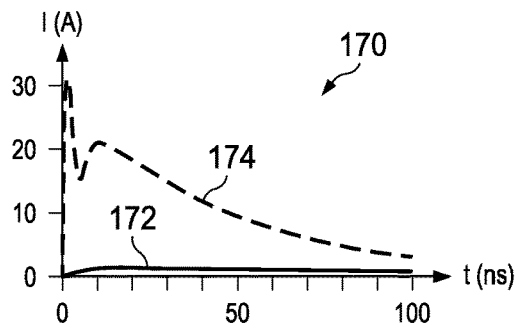
FIG. 3 is a graph illustrating example HBM and IEC 61000-4-2 discharge current curves.
Figure 4:
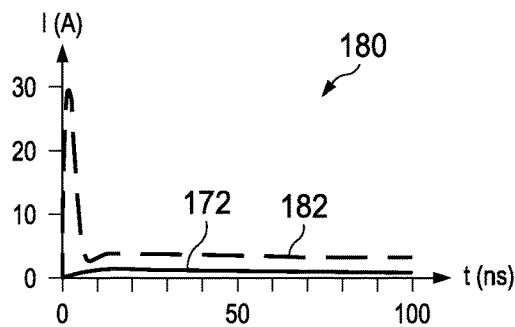
FIG. 4 is a graph illustrating example HBM and ISO 10605 discharge current curves.

FIG. 3 shows a transient current graph 170 with a first curve 172 representing a human body model (HBM) 2 kV ESD event with a peak current of around 1.3 A, as well as an 8 kV IEC 61000-4-2 contact discharge current curve 174 with a peak current over 30 A. In addition, FIG. 4 provides an ESD transient current graph 180 showing the HBM transient current curve 172 as well as an 8 kV ISO 10605 discharge current curve 182 having a peak current near 30 A.

Figure 2:
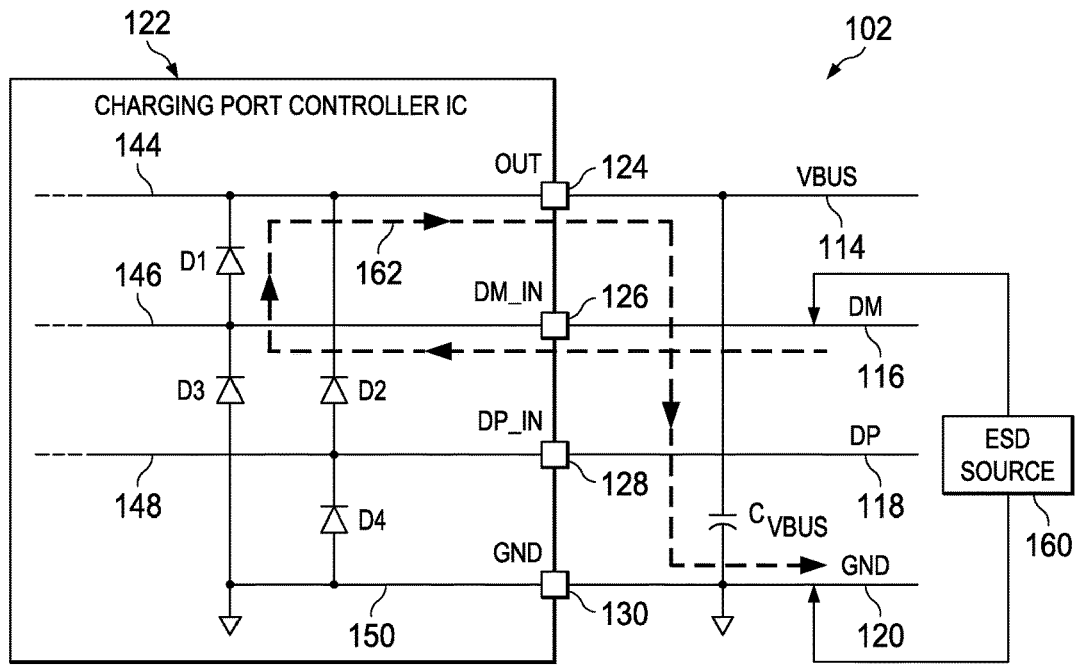
FIG. 2 is a schematic diagram illustrating operation of a first ESD protection diode of the charging port controller IC for directing transient current from a first USB data terminal to a connected USB bus capacitance through the IC VBUS terminal.

As shown in FIG. 2, application of one of the transient current ESD events represented by the curves 172, 174 or 182 to the DM line 118 causes transient current flow along a path 162, with the transient current initially entering the IC 122 at the first data terminal 126 and flowing along the conductive structure 146 through the protection diode D1. The transient current path 162 continues from the cathode of D1 to the conductive structure 144 and exits the IC 122 at the first power terminal 124, and is conducted through the capacitance $C_{VBUS}$ to the GND second power connection 120 of the circuit board 102. The inventors have appreciated that the provision of the diode D1 within the integrated circuit 122 with an anode connected to the first data terminal 126 and a cathode connected to the first power terminal 124 protects the IC 122 and the overall system 100 from such an ESD event in which a positive transient voltage is applied to the first data terminal 126. In this example, moreover, it is noted that an ESD event providing a negative voltage to the DM terminal 126 results in conduction of transient current through the third diode D3 directly to the circuit ground 120 of the circuit board 102.

Figure 5:
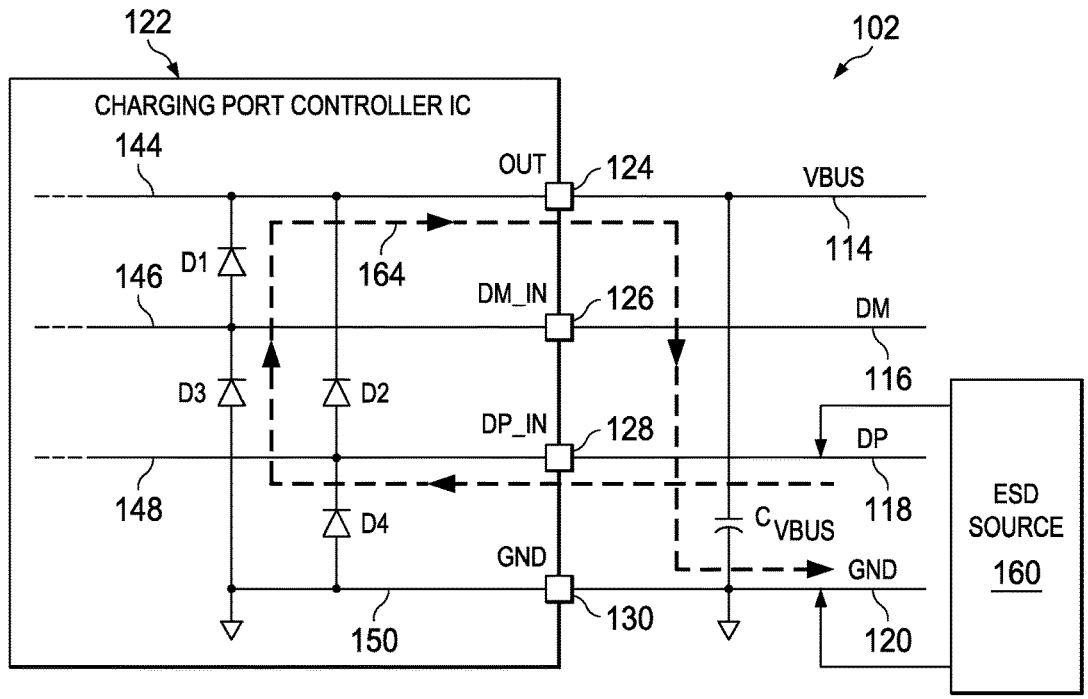
FIG. 5 is a schematic diagram illustrating operation of a second ESD protection diode of the charging port controller IC for directing transient current from a second USB data terminal to the USB bus capacitance through the VBUS terminal.

FIG. 5 illustrates operation of the second ESD protection diode D2 for directing transient current from the second USB data terminal 128 (DP) to the board-mounted capacitance $C_{VBUS}$ through the VBUS IC output terminal 124. In this case, the transient current conducts along a path 164 from the data terminal 128 through diode D2, and exiting through the first power terminal 124 for dissipation at the bus capacitance $C_{VBUS}$. A negative ESD event with respect to the DP data terminal 128 in this case results in conduction of transient current through the lower fourth diode D4.

As seen above, the $C_{VBUS}$ capacitor (or distributed capacitance having a specified minimum total value) is advantageously employed to provide ESD transient protection for the system 100 including the USB interface IC 122 and the host circuit board 102, and also operates according to the USB standards to mitigate or prevent voltage droop and dynamic detach flyback voltage resulting from operation of the charging control switch circuit 138, 140 (FIG. 1). In certain practical applications, the USB bus capacitance may be distributed among multiple ports, with capacitances connected on either side of the charging control switch 138 (FIG. 1), and need not provide a total above 120 μF. In this regard, lower capacitance values still serve to provide ESD protection for the data lines DM and DP in combination with the on-chip protection diodes D1 and D2. In this manner, providing the on-chip high-side diodes D1 and D2 from the USB data terminals 126 and 128 to the VBUS terminal 124, and further providing the low-side diodes D3 and D4 to ground, creates an on-chip ESD protection network for the IC 122 to discharge the system-level ESD current. Moreover, as previously discussed, the diodes D1 and D2 are normally not conducting during typical data transfer operation of the USB system, and do not significantly impact the data line impedance. Furthermore, the provision of an on-chip ESD protection circuit avoids the need for external discrete components and/or dedicated ESD protection ICs on the host printed circuit board 102, thereby saving board space and reducing system cost. In addition, the provision of the diodes D1-D4 (or just D1 or D2 in certain embodiments) has minimal impact on the die size of the charging port controller IC 122 or other USB interface ICs. The clamping voltage on USB data pins is determined by the equivalent series resistance (ESR) and equivalent of series inductance (ESL) of external capacitor and the parasitic resistance and inductance from the IC to the capacitor, wherein the provision of the on-chip ESD protection diodes D1 and/or D2 does not adversely impact the resistive and/or capacitive impedance of the USB data lines.

Figure 6:
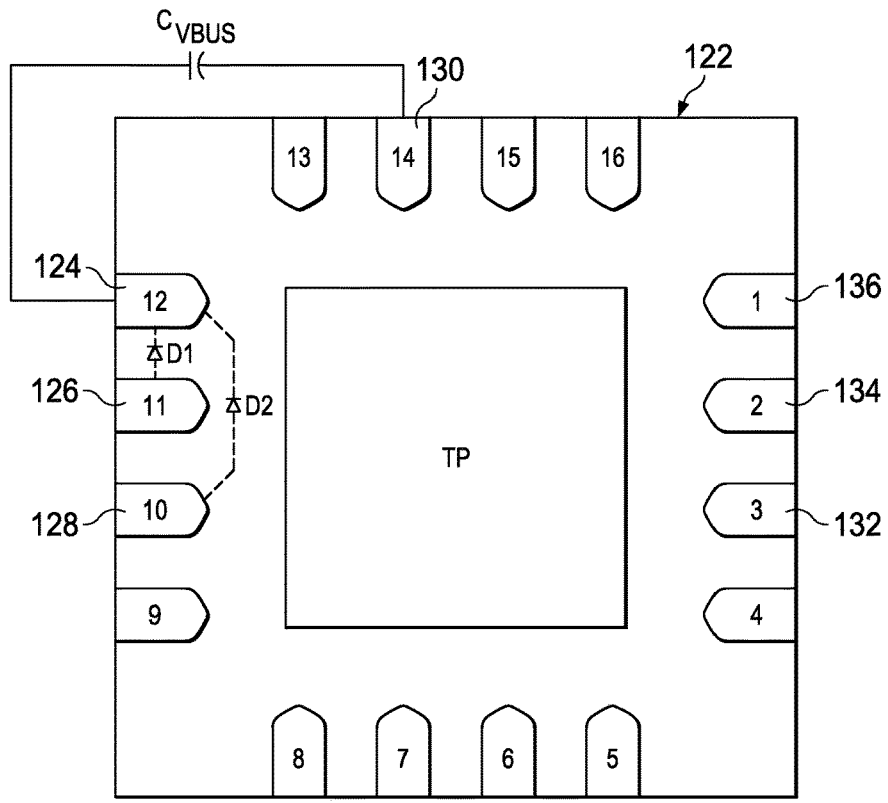
FIG. 6 is a bottom plan view illustrating a USB charging port controller IC with integral ESD protection diodes for USB data lines.

FIG. 6 shows a bottom plan view of the USB charging port controller IC 122, in this case a surface mount integrated circuit with 16 terminals or pads numbered 1-16 as shown. FIG. 6 also schematically shows the internal or integral ESD protection diodes D1 and D2 for protecting the USB data lines, which are preferably formed in the IC 122 proximate the terminals or pins 124, 126 and 128 for protecting the remaining internal circuitry of the IC 122. In addition, FIG. 6 schematically illustrates the USB bus voltage capacitor or capacitance $C_{VBUS}$ connected between the terminals 12 and 14 for cooperative ESD protection to sink transient current through the diodes D1, D2. As previously mentioned, the illustrated example includes both diodes D1 and D2. Alternate embodiments are possible in which one of the diodes D1 or D2 may be omitted. Moreover, various embodiments are possible in which the low side diodes D3 and/or D4 can be omitted.

Figure 7:
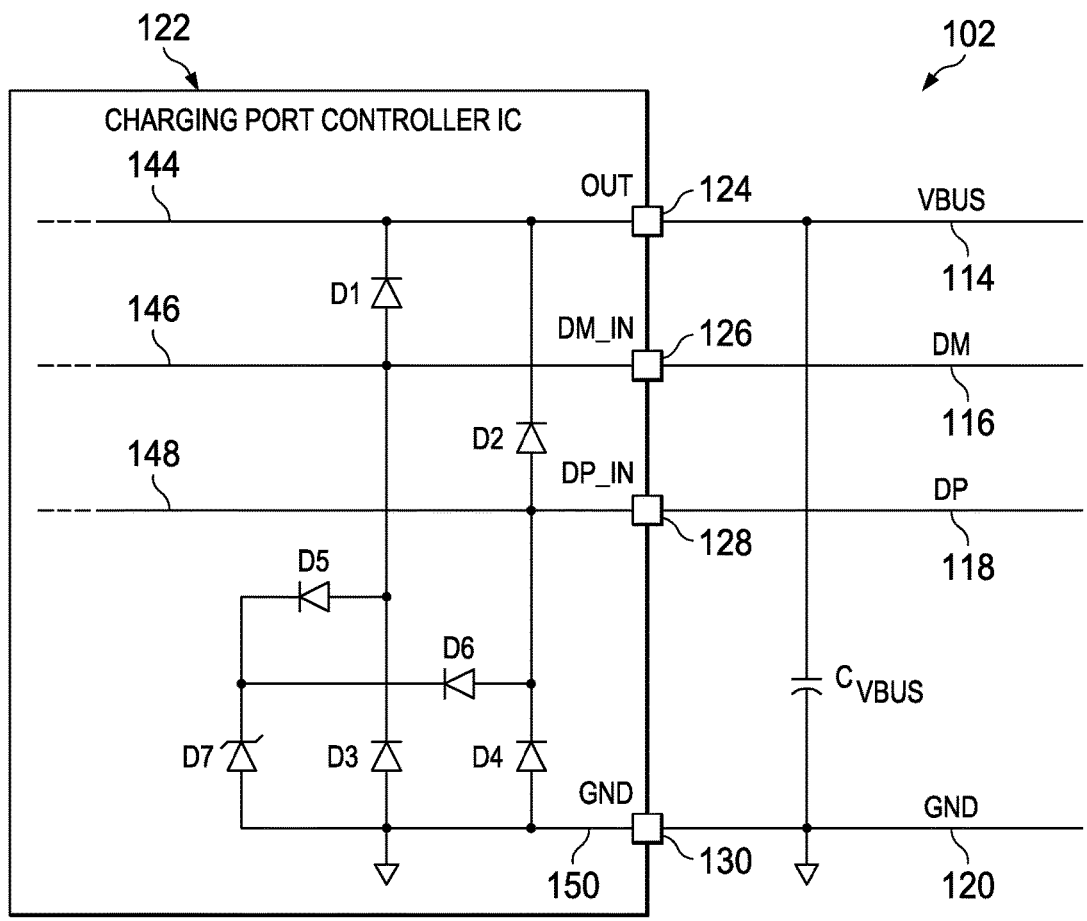
FIG. 7 is a schematic diagram illustrating another USB charging port controller IC embodiment with low side Zener diode providing additional clamped ESD protection for the USB data lines.

FIG. 7 is a schematic diagram illustrating another USB charging port controller IC embodiment 122 with the above-described ESD protection diodes D1-D4 connected as previously shown in FIGS. 1, 2 and 5. In addition, a Zener diode D7 is included for voltage clamping to provide further ESD protection, along with fifth and sixth diodes D5 and D6, where the Zener D7 and the diodes D5 and D6 are formed in the integrated circuit 122. In this case, the Zener diode D7 includes an anode electrically connected to the second power terminal 130, with the fifth diode D5 having an anode electrically connected to the first data terminal 126 between the cathode of D3 and the anode of D1, and the diode D5 has a cathode connected to the cathode of the Zener diode D7. Similarly, the sixth diode D6 has an anode electrically connected to the second data terminal 128 and a cathode electrically connected to the cathode of the Zener diode D7. The embodiment of FIG. 7 thus provides clamping type ESD protection for the USB data terminals in combination with the above-described diodes D1 and D2 for enhanced on-chip solutions without requiring external board-mounted circuitry. In another alternate implementation, the cathode of the Zener diode D7 is coupled with the first power terminal 124, and D5 and D6 are omitted.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. An integrated circuit for interfacing Universal Serial Bus (USB) power and data signaling with a USB host circuit, the integrated circuit comprising:
   a first power terminal for electrical coupling with a first power connection of a host circuit board to a USB bus voltage terminal of a USB connector on the USB host circuit board to provide a positive bus voltage;
   a second power terminal for electrical coupling with a second power connection of the host circuit board to a USB ground terminal of the USB connector;
   a first data terminal for electrical coupling with a first data connection of the host circuit board to a first USB data terminal of the USB connector; and
   a first diode formed in the integrated circuit and comprising an anode contacting the first data terminal, and a cathode contacting the first power terminal.

2. The integrated circuit of claim 1, comprising:
   a second data terminal for electrical coupling with a second data connection of the host circuit board to a second USB data terminal of the USB connector; and
   a second diode formed in the integrated circuit and comprising an anode electrically connected to the second data terminal, and a cathode electrically connected to the first power terminal.

3. The integrated circuit of claim 2, comprising:
   a third diode formed in the integrated circuit and comprising an anode electrically connected to the second power terminal and a cathode electrically connected to the first data terminal; and
   a fourth diode formed in the integrated circuit and comprising an anode electrically connected to the second power terminal and a cathode electrically connected to the second data terminal.

4. The integrated circuit of claim 3, comprising a charging control circuit coupled between the first power terminal and a power input terminal including a switching device for controlling a charging current supplied to the first power terminal at the positive bus voltage.

5. The integrated circuit of claim 3, comprising:
   a Zener diode formed in the integrated circuit and comprising an anode electrically connected to the second power terminal, and a cathode;
   a fifth diode formed in the integrated circuit and comprising an anode electrically connected to the first data terminal, and a cathode electrically connected to the cathode of the Zener diode; and a sixth diode formed in the integrated circuit and comprising an anode electrically connected to the second data terminal, and a cathode electrically connected to the cathode of the Zener diode.

6. The integrated circuit of claim 1, comprising another diode formed in the integrated circuit and comprising an anode electrically connected to the second power terminal and a cathode electrically connected to the first data terminal.

7. The integrated circuit of claim 6, comprising a charging control circuit coupled between the first power terminal and a power input terminal including a switching device for controlling a charging current supplied to the first power terminal at the positive bus voltage.

8. The integrated circuit of claim 6, comprising:
a Zener diode formed in the integrated circuit and comprising an anode electrically connected to the second power terminal, and a cathode; and
a fifth diode formed in the integrated circuit and comprising an anode electrically connected to the first data terminal, and a cathode electrically connected to the cathode of the Zener diode.

9. The integrated circuit of claim 1, comprising a charging control circuit coupled between the first power terminal and a power input terminal including a switching device for controlling a charging current supplied to the first power terminal at the positive bus voltage.

10. The integrated circuit of claim 1, comprising:
a first data output terminal for electrical coupling with the USB host circuit of the host circuit board, the first data output terminal being electrically coupled with the first data terminal; and
a second data output terminal for electrical coupling with the USB host circuit of the host circuit board, the second data output terminal being electrically coupled with the second data terminal.

11. A circuit board assembly, comprising:
a circuit board;
a Universal Serial Bus (USB) connector mounted to the circuit board, and comprising:
a USB bus voltage terminal electrically connected to a first power connection of the circuit board,
a USB ground terminal electrically connected to a second power connection of the circuit board, and
a first USB data terminal electrically connected to a first data connection of the host circuit board;
a bus capacitance electrically connected between the first power connection and the second power connection; and
an integrated circuit for interfacing USB power and data signaling with a USB host circuit, the integrated circuit comprising:
a first power terminal electrically coupled with the first power connection to provide a positive bus voltage,
a second power terminal electrically coupled with the second power connection,
a first data terminal electrically coupled with the first data connection, and
a first diode formed in the integrated circuit and comprising an anode contacting the first data terminal, and a cathode contacting the first power terminal for directing transient current from the first data terminal to the bus capacitance through the first power terminal.

12. The circuit board assembly of claim 11, wherein the USB connector comprises a second USB data terminal electrically connected to a second data connection of the host circuit board; and wherein the integrated circuit comprises a second data terminal electrically coupled with the second data connection, and a second diode formed in the integrated circuit and comprising an anode electrically connected to the second data terminal, and a cathode electrically connected to the first power terminal.

13. The circuit board assembly of claim 12, wherein the integrated circuit comprises:
a third diode formed in the integrated circuit and comprising an anode electrically connected to the second power terminal and a cathode electrically connected to the first data terminal; and
a fourth diode formed in the integrated circuit and comprising an anode electrically connected to the second power terminal and a cathode electrically connected to the second data terminal.

14. The circuit board assembly of claim 13, wherein the integrated circuit comprises:
a Zener diode formed in the integrated circuit and comprising an anode electrically connected to the second power terminal, and a cathode;
a fifth diode formed in the integrated circuit and comprising an anode electrically connected to the first data terminal, and a cathode electrically connected to the cathode of the Zener diode; and
a sixth diode formed in the integrated circuit and comprising an anode electrically connected to the second data terminal, and a cathode electrically connected to the cathode of the Zener diode.

15. The circuit board assembly of claim 11, wherein the integrated circuit comprises another diode formed in the integrated circuit and comprising an anode electrically connected to the second power terminal and a cathode electrically connected to the first data terminal.

16. The circuit board assembly of claim 15, wherein the integrated circuit comprises a charging control circuit coupled between the first power terminal and a power input terminal of the integrated circuit, the charging control circuit comprising a switching device for controlling a charging current supplied to the first power terminal at the positive bus voltage.

17. The circuit board assembly of claim 15, wherein the integrated circuit comprises:
a Zener diode formed in the integrated circuit and comprising an anode electrically connected to the second power terminal, and a cathode; and
a fifth diode formed in the integrated circuit and comprising an anode electrically connected to the first data terminal, and a cathode electrically connected to the cathode of the Zener diode.

18. The circuit board assembly of claim 11, wherein the integrated circuit comprises a charging control circuit coupled between the first power terminal and a power input terminal of the integrated circuit, the charging control circuit comprising a switching device for controlling a charging current supplied to the first power terminal at the positive bus voltage.

19. The circuit board assembly) of claim 11, wherein the integrated circuit comprises:
a first data output terminal for electrical coupling with the USB host circuit of the host circuit board, the first data output terminal being electrically coupled with the first data terminal; and a second data output terminal for electrical coupling with the USB host circuit of the host circuit board, the second data output terminal being electrically coupled with the second data terminal.

20. A Universal Serial Bus (USB) charging port controller integrated circuit, comprising:
- a first power terminal for electrical coupling to a positive USB bus voltage node via a first power connection of a host circuit board;
- a second power terminal for electrical coupling to a USB ground node via a second power connection of the host circuit board;
- a first data terminal for electrical coupling to a first USB data node via a first data connection of the host circuit board;
- a first data output terminal electrically coupled with the first data terminal for electrical coupling with a USB host circuit of the host circuit board;
- a second data terminal for electrical coupling to a second USB data node via a second data connection of the host circuit board;
- a second data output terminal electrically coupled with the second data terminal for electrical coupling with the USB host circuit;
- a power input terminal for receiving power from an associated power supply;
- a charging control circuit coupled between the first power terminal and the power input terminal, the charging control circuit including a switching device for controlling a charging current supplied to the USB bus voltage node at a positive bus voltage;
- a first diode formed in the integrated circuit and comprising an anode contacting the first data terminal, and a cathode contacting the first power terminal for directing transient current from the first data terminal to the first power terminal; and
- a second diode formed in the integrated circuit and comprising an anode electrically connected to the second data terminal, and a cathode electrically connected to the first power terminal for directing transient current from the second data terminal to the first power terminal.

* * * * *